(12) United States Patent
Townsend et al.

(10) Patent No.: US 11,815,628 B2
(45) Date of Patent: Nov. 14, 2023

(54) APPARATUS PROVIDING A PLURALITY OF LIGHT BEAMS

(71) Applicant: STMICROELECTRONICS (RESEARCH & DEVELOPMENT) LIMITED, Marlow (GB)

(72) Inventors: Christopher Townsend, Edinburgh (GB); Thineshwaran Gopal Krishnan, Edinburgh (GB); James Peter Drummond Downing, Doune (GB); Kevin Channon, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 0 days.

(21) Appl. No.: 18/158,448

(22) Filed: Jan. 23, 2023

(65) Prior Publication Data

US 2023/0161009 A1    May 25, 2023

Related U.S. Application Data

(63) Continuation of application No. 16/542,164, filed on Aug. 15, 2019, now Pat. No. 11,573,293.

(30) Foreign Application Priority Data

Aug. 15, 2018 (EP) .................................... 18189177

(51) Int. Cl.
*G01S 7/481* (2006.01)
*G01J 1/44* (2006.01)
(Continued)

(52) U.S. Cl.
CPC ............... *G01S 7/4814* (2013.01); *G01J 1/44* (2013.01); *G01S 7/4816* (2013.01); *G01S 17/10* (2013.01);
(Continued)

(58) Field of Classification Search
CPC ...... G01S 7/4814; G01S 7/4816; G01S 17/10; G01S 7/4817; G01S 17/89; G01S 7/4815;
(Continued)

(56) References Cited

U.S. PATENT DOCUMENTS

| | | | |
|---|---|---|---|
| 6,901,221 B1 | 5/2005 | Jiang et al. | |
| 8,970,374 B2* | 3/2015 | Guetta | G08B 13/2491 340/556 |
| 9,063,313 B1 | 6/2015 | Hasharoni | |
| 9,507,111 B2* | 11/2016 | Collins | G02B 6/124 |

(Continued)

FOREIGN PATENT DOCUMENTS

| | | |
|---|---|---|
| CN | 101223469 A | 7/2008 |
| CN | 103246066 A | 8/2013 |

(Continued)

OTHER PUBLICATIONS

Stern, "Design of a silicon avalanche photodiode pixel with integrated laser diode using back-illuminated crystallographically etched silicon-on-sapphire with monolithically integrated microlens for dual-mode passive and active imaging arrays," Proceedings of the International Society for Optics and Photonics, *Detectors and Imaging Devices: Infrared, Focal Plane, Single Photon* 7780: Aug. 2010, 15 pages.

*Primary Examiner* — Seung C Sohn
(74) *Attorney, Agent, or Firm* — Seed IP Law Group LLP

(57) ABSTRACT

An apparatus comprises an array of vertical-cavity surface-emitting lasers. Each of the vertical-cavity surface-emitting lasers is configured to be a source of light. The apparatus also comprises an optical arrangement configured to receive light from a plurality of the vertical-cavity surface-emitting lasers and to output a plurality of light beams.

20 Claims, 7 Drawing Sheets

(51) Int. Cl.
    *G01S 17/10*     (2020.01)
    *G02B 27/30*     (2006.01)
    *H01S 5/42*     (2006.01)
    *H01S 5/02253*     (2021.01)

(52) U.S. Cl.
    CPC .......... *G02B 27/30* (2013.01); *H01S 5/02253* (2021.01); *H01S 5/423* (2013.01); *G01J 2001/448* (2013.01); *G01J 2001/4466* (2013.01)

(58) Field of Classification Search
    CPC ...... G01S 7/10; G01S 7/42; G01J 1/44; G01J 2001/4466; G01J 2001/448; G01J 2001/442; G01J 2001/446; G02B 27/30; H01S 5/02253; H01S 5/423
    See application file for complete search history.

(56) References Cited

U.S. PATENT DOCUMENTS

| | | |
|---|---|---|
| 2004/0057114 A1 | 3/2004 | Hatjasalo et al. |
| 2007/0071056 A1 | 3/2007 | Chen |
| 2014/0064305 A1 | 3/2014 | Sipes, Jr. et al. |
| 2015/0362585 A1 | 12/2015 | Ghosh et al. |
| 2016/0282453 A1 | 9/2016 | Pennecot et al. |
| 2018/0120931 A1 | 5/2018 | Shpunt et al. |

FOREIGN PATENT DOCUMENTS

| | | |
|---|---|---|
| CN | 204424681 U | 6/2015 |
| CN | 106371085 A | 2/2017 |
| CN | 106464366 A | 2/2017 |
| CN | 106772838 A | 5/2017 |
| CN | 107942521 A | 4/2018 |
| EP | 2827175 A2 | 1/2015 |
| EP | 3182160 A1 | 6/2017 |
| WO | WO 2005036211 A2 | 4/2005 |

\* cited by examiner

APPARATUS PROVIDING A PLURALITY OF LIGHT BEAMS

BACKGROUND

Technical Field

Some embodiments relate to an apparatus and in particular, but not exclusively, to an apparatus providing a plurality of light beams.

Description of the Related Art

Photosensitive devices are employed in a range of applications, for example determination of light levels, communications, range detection etc.

For example single photon avalanche diodes (SPAD) may be used as a detector of reflected light from a light source. In general, an array of pixels including SPAD sensing elements are provided as a sensor in order to detect a reflected light pulse from the light source. A photon may generate a carrier in the SPAD through the photo electric effect. The photogenerated carrier may trigger an avalanche current in one or more of the SPADs in an SPAD array. The avalanche current may signal an event, namely that a photon of light has been detected.

The use of SPAD arrays for ranging is well known. For example SPAD arrays and SPAD sensors have been used to determine time-of-flight distances for ranging applications in mobile devices.

The source of the light source may be provided by one or more vertical-cavity surface-emitting laser (VCSEL) diodes.

BRIEF SUMMARY

According to an aspect, there is provided an apparatus comprising: an array of vertical-cavity surface-emitting lasers, each of said vertical-cavity surface-emitting lasers being configured to be a source of light; and an optical arrangement configured to receive light from a plurality of said vertical-cavity surface-emitting lasers and to output a plurality of light beams.

The optical arrangement may comprise at least one optical element configured to provide a beam shaping function.

The beam shape may be rectangular.

The optical arrangement may comprise a shared optical element which is configured to receive light from each of said vertical-cavity surface-emitting lasers of said array.

The optical arrangement may comprise a plurality of optical elements, an optical element being provided for each beam.

The optical arrangement may comprise an array of optical elements with an optical element being provided for each light beam, one or more vertical-cavity surface-emitting lasers providing each light beam.

The optical arrangement may comprises one or more micro-lenses provided on a substrate providing said array of vertical cavity surface-emitting lasers.

The optical arrangement may comprise a plurality of lenses on said array of vertical-cavity surface-emitting lasers, one for each of said vertical-cavity surface-emitting lasers.

The array of vertical-cavity surface-emitting laser may be provided by a plurality of singulated vertical-cavity surface-emitting laser dies.

The optical arrangement may comprise a plurality of micro-lenses provided on a substrate providing said array of vertical-cavity surface-emitting lasers and a shared optical element which is configured to receive light from each of said vertical-cavity surface-emitting lasers of said array.

The optical arrangement may comprise a plurality of micro-lenses provided on a substrate providing said array of vertical-cavity surface-emitting lasers and a plurality of further optical components, one further optical component being provided for each beam.

The array of vertical-cavity surface-emitting laser may be provided by a plurality of singulated vertical-cavity surface-emitting laser dies and said optical arrangement may comprise a plurality of optical components, one being provided for each beam.

The apparatus may comprise control circuitry configured to control which of said vertical-cavity surface-emitting lasers are activated The control circuitry may be configured to control said array of vertical-cavity surface-emitting laser s to provide said beams sequentially.

According to another aspect, there is provided a detector comprising; an apparatus described previously; and a light detector configured to detect light from said apparatus reflected from one or more objects.

The light detector may comprise an array of single photon avalanche diodes.

The detector may be a ranging detector.

The detector may use time of flight to determine distance to an object.

BRIEF DESCRIPTION OF THE SEVERAL VIEWS OF THE DRAWINGS

Some embodiments will now be described by way of example only and with reference to the accompanying Figures in which.

DETAILED DESCRIPTION

Some embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Some embodiments may be provided in devices for determining the distance to an object. One method is called "Time of Flight" (ToF). This method comprises sending a light signal towards the object and measuring the time taken by the signal to travel to the object and back. The calculation of the time taken by the signal for this travel may be obtained by measuring the phase shift between the signal coming out of the light source and the signal reflected from the object and detected by a light sensor. Knowing this phase shift and the speed of light enables the determination of the distance to the object.

Single photon avalanche diodes (SPAD) may be used as a detector of reflected light. In general an array of SPADs are provided as a sensor in order to detect a reflected light pulse. A photon may generate a carrier in the SPAD through the photoelectric effect. The photogenerated carrier may trigger an avalanche current in one or more of the SPADs in an SPAD array. The avalanche current may signal an event, namely that a photon of light has been detected.

It should be appreciated that other embodiments may be used with other types of detector. By way of example only, some embodiments may be used with a fast photodiode based ToF module or in LIDAR (light detection and ranging) applications. LIDAR has many applications including consumer electronics, automotive, robotics, surveying and so on.

An example LIDAR system uses a light source, for example a vertical cavity surface emitting laser (VCSEL), to generate light pulses which are reflected from a surface and then detected at a receiver or detector, for example a photodiode or single photon avalanche diode (SPAD) array.

The time difference between the light being transmitted and received provides the distance or range value using the equation D=S*T, where T is the time difference, S the speed of light and D the distance from the transmitter to the reflecting object and back again.

Figure 6:
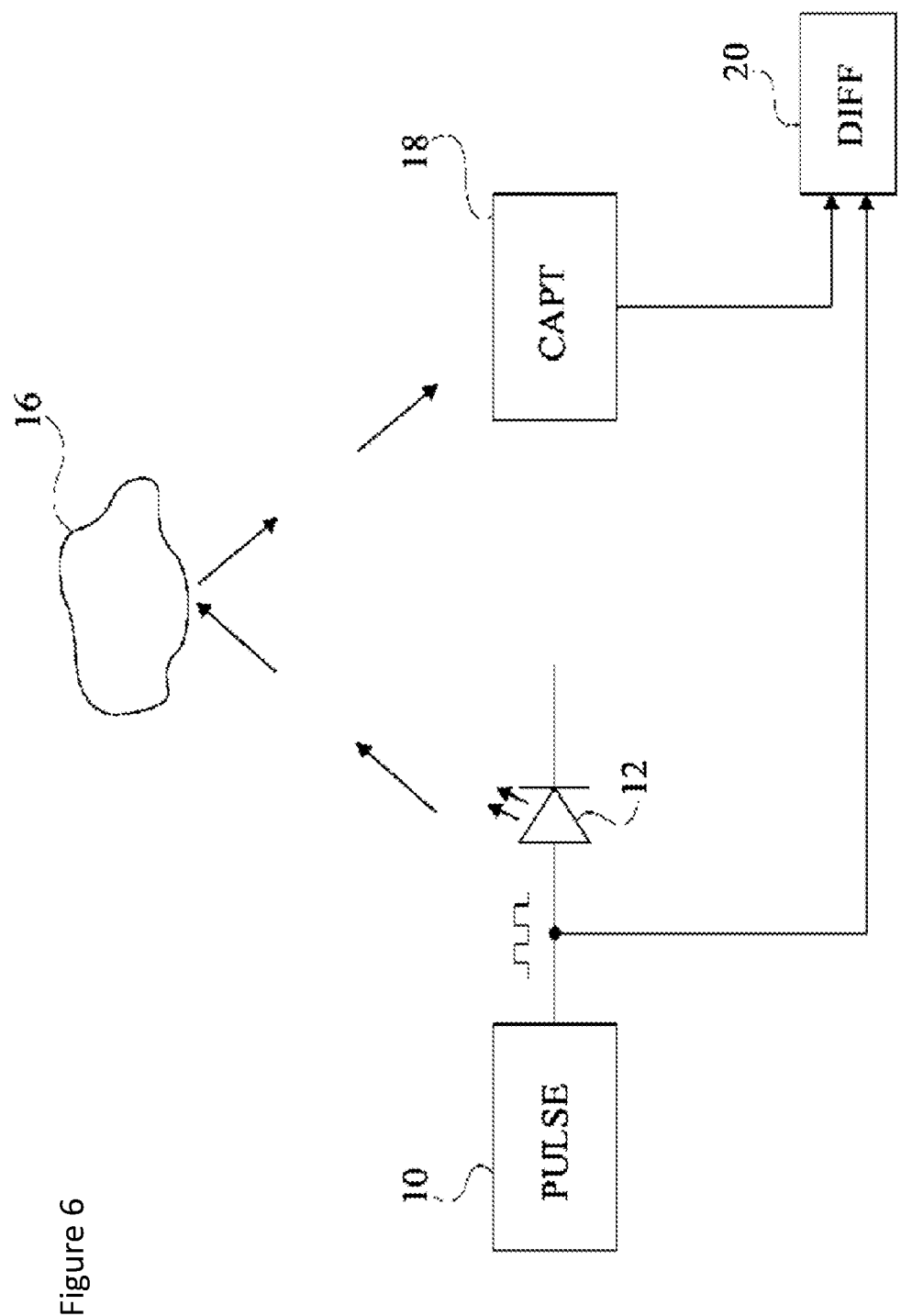
FIG. 6 schematically shows an arrangement using a time of flight principle.

FIG. 6 illustrates the general principle of a "Time of Flight" method. In FIG. 6, a generator 10 (referenced as box PULSE in FIG. 6) provides a periodic electric signal (for example, square-shaped). This signal powers a light source 12. An example of a light source 12 may be for example, a laser diode. The signal coming out of light source 12 is transmitted towards an object 16 and is reflected by this object. The reflected light signal is detected by a light sensor (shown as box CAPT in FIG. 6) 18. The signal on sensor 18, is thus phase-shifted from the signal provided by the generator for an ideal system by a time period proportional to twice the distance to object 16 (In practice there is also electrical to optical delay time from the light source). Calculation block 20 (shown as box DIFF in FIG. 6) receives the signals generated by generator 10 and by sensor 18 and calculates the phase shift between these signals to obtain the distance to object 16.

The light source may be provided by a vertical-cavity surface-emitting laser (VCSEL). A VCSEL is a semiconductor-based laser diode that emits an optical beam "vertically" from its top surface. The vertical cavity surface emitting laser is provided with current by a driver circuit which is typically configured to be able to control the current through the laser in order to produce pulse or other waveform outputs.

Some embodiments may provide a relatively compact SPAD based ToF system. This may have application in, for example, the mobile consumer market. Other embodiments may be used with other types of detector. Some embodiments may be used in any application which requires a light source arrangement. Some of those applications may be without a light detector.

It has been proposed to illuminate a full field of view with a VCSEL based illumination source array and simultaneously reading out a full frame with a SPAD based sensor array.

However, there may be one or more issues which may be considered. One issue may be the power consumption when the full SPAD array is actively reading out at the same time.

Another issue relates to the drive current to drive the VCSEL array at the same time. To this end, the array may be operated in a scanning mode. In a scanning mode one or more, but not all, of the rows may be scanned or activated in turn. It should be appreciated that scanning allows for a lower average power versus an equivalent non-scanned implementation.

It should be appreciated that in some embodiments there may be scanning of the array of light sources. In other embodiments, there whole array of light sources may be activated at the same time.

One or other or both of these issues may be considered where the SPAD or other detector array and/or VCSEL arrays are larger in size. However, it should be appreciated that one or both of these issues may also be taken into consideration with smaller VCSEL and/or detector arrays.

One or other or both of these issue may be considered where the SPAD or other detector array and VCSEL array are being applied in a system where power consumption is desired to be minimized. This may for example be in a mobile communications type application.

In some embodiments, one or other or both of the above discussed issues may be addressed by one of more of: providing scanning illumination on the transmit side by the VCSEL array and providing scanning read-out on the receive side by the SPAD array.

The transmit scanning may be achieved by one or more of:
1) An addressable VCSEL array with integrated micro-optics etched directly into a GaAs substrate which fans out the VCSEL output to N number of sub-optics in what is termed the primary optic. Each sub-optic creates the illumination in the desired portion of the object plane. Each channel may have a dedicated beam shaping function.
2) An addressable VCSEL array with integrated micro-optics etched directly into a GaAs substrate which fans out the VCSEL output to a single imaging lens with a focal length designed to give a FoV (field of view) dependent on the channel separation in the VCSEL array. The optic has a single beam shaping function to generate the desired output in the object plane. One beam shaping function is shared between N channels.
3) N VCSELs (optionally with integrated optics) are placed below N optics. Each optic creates an illumination in the desired portion of the object plane. This embodiment may make use of a high precision assembly which can be achieved with methods such as transfer printing.

These options are described in more detail below.

Some embodiments may provide a scanned read-out with a lower power

VCSEL driver.

Figure 1:
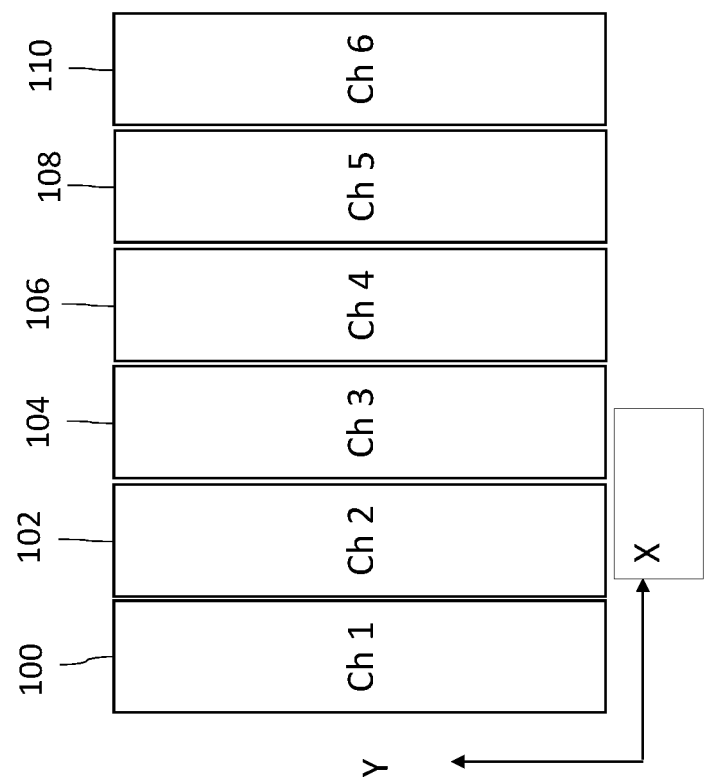
FIG. 1 shows a schematic view N channels provided by a light source.

Reference is made to FIGS. 1 which shows N addressable channels or beams projected into the far field. In the example shown in FIG. 1 there are 6 channels 100, 102, 104, 106, 108 and 110. Each of these channels represents a beam which is generated from one or more VCSEL sources. In this example there are 6 channels. However, it should be appreciated that this is by way of example only and there may be more or less than the 6 channels shown. In this example, each channel is shown as being generally rectangular in the X-Y direction. However this is by way of example only and in different embodiments, the channels may be of a different configuration in the X-Y direction.

Thus in some embodiments, each channel can be provided by a plurality of VCSELs or a single VCSEL. Each channel will contribute to each section of the output. In some embodiments, there is a one to one relationship between a channel in the VCSEL array and a corresponding illumination patch or area in the output.

In some embodiments, the channels are provided in turn and in a scanning order one after the other. In other embodiments, two or more channels may be provided at a time. In some embodiments, all of the channels may be provided at a time. In other embodiments, any order may be used for providing the channels.

First embodiments will now be described.

Figure 2:
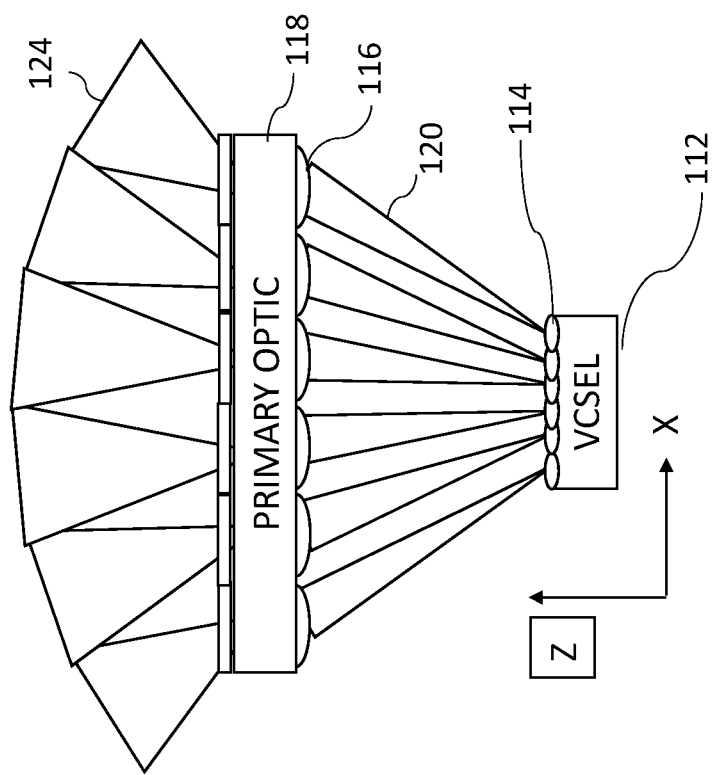
FIG. 2 shows a first arrangement for providing N light channels.

Reference is made to FIG. 2 which shows an addressable VCSEL array 112 with n channels. This array is provided on a single semiconductor die. This array may provide the channels shown in FIG. 1 or any other suitable configuration of channels.

The VCSEL array is provided with micro-lenses. The micro-lenses are integrated as part of the die providing the VCSEL array. The micro-lenses may be etched directly into the substrate material of the VCSEL (for example GaAs). The lenses may be freeform in surface profile. The micro-lenses may include a diffusing function as well as a lensing function.

The micro-lenses 114 are configured to direct each channel to an associated primary optic component. In particular, the array is made up of N VCSEL sources and each of the N VCSEL sources is provided with a micro-lens. The micro-lens are configured to reduce the divergence of the beam provided by each VCSEL source to thereby allow each of the N channels to be accommodated. The beams or channels 120 are output from the micro-lenses.

In one modification, a micro-lens may be shared by two or more VCSEL sources. This may be in an arrangement where a channel is provided by a plurality of VCSEL sources.

The arrangement also comprises a primary optic arrangement 118. The primary optic arrangement comprises an array of optics which collimates and provides a beam shaping function for each channel. The primary optic arrangement 118 comprises input lenses 116, one for each channel. The respective input lens receives the respective beam 120 and collimates that beam. The primary optic arrangement 118 is made up of N sub-optics to provide a collimation by the input lenses 116 and re-direction and beam shaping by output lenses 122 to provide respective output beams 124. It can be realized with either diffractive or refractive optical arrangements.

In some embodiments, the number of micro-lenses and the number of input lenses may be the same. In some embodiments, the number of micro-lenses and the number of input lenses may not be the same. In some embodiments, a micro-lens may be provided for each VCSEL and an input lens for each channel, there being one or more VCSELs providing each channel.

The primary optic arrangement 118 is thus configured to beam shape the respective beam and provide output beams 124 which provide the channels such as shown in FIG. 1. The beam shape may be application dependent. In some embodiments, the beam shape may be rectangular. However, in other embodiments a different shaped output may be provided.

In some embodiments, the VCSEL array may be relatively compact. This may be associated with a reduced cost. The smaller module may be advantageously integrated with a relative small communications device or the like. Due to the fact that the VCSEL output is spread out by the integrated micro-optics, the light can be distributed to the relevant sub-optics without having to increase the die size so that the channel pitch can match the sub-optic pitch which is much larger.

Some embodiments may provide a flexibility in the provided output. The n channels may be shaped into various channel shapes and field of views for the same underlying VCSEL integrated circuit or chip. The re-shaping can be achieved with a refractive micro-lens array or a diffractive diffuser or any other suitable arrangement.

Some embodiments may be robust to assembly tolerances. The spacing of the sub-optics in the primary optic may be oversized according to the assembly tolerances Some embodiments are such that the optical power is shared between the VCSEL integrated optics and the primary optics. This may allow for a wider field of view but with relatively low index primary optic.

Some embodiments may use a backside emission VCSEL array. In order to integrate the optics directly into the VCSEL substrate, the VCSEL may be a backside emitter as the light is propagating in the desired direction to allow micro lens integration.

Figure 3:
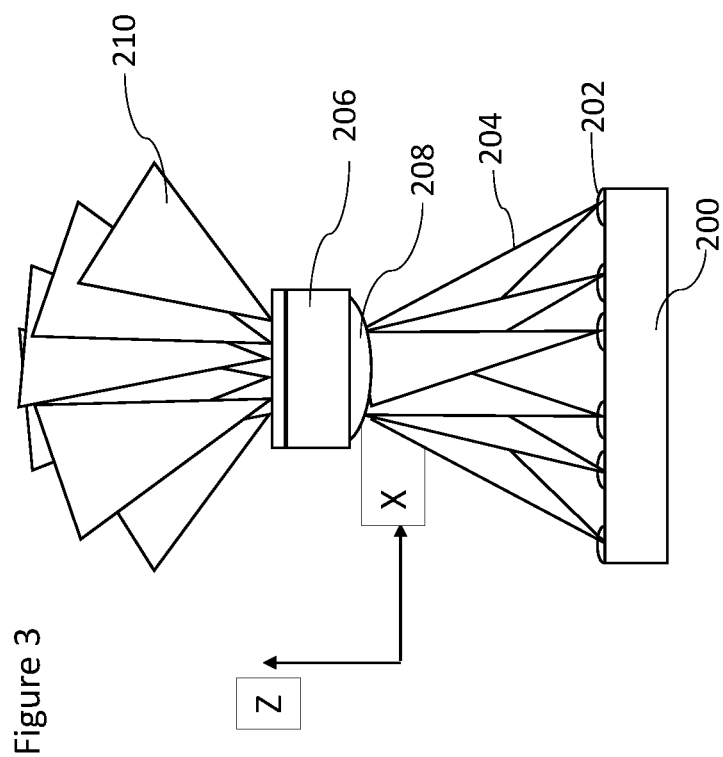
FIG. 3 shows a second arrangement for providing N light channels.

Second embodiments will now be described. Reference is made to FIG. 3 which shows another embodiment.

An array 200 of addressable VCSELs is provided. This may be similar to that discussed in relation to FIG. 2. The array of VCSELs may provide n channels.

The array 200 comprises integrated micro-lenses 202. This micro-lenses may be configured to re-direct each channel or beam provided by the VCSEL array to the primary optic. The micro-lenses may reduce the divergence to allow for a relatively high f-number (f/#) (f/# is a ratio of the effective focal length to the effective aperture diameter). The value of f/# may be design dependent. In some embodiments, f/# may be up to 16.

In some embodiments, there may be a micro-lens for each VCSEL. In other embodiments, there may be a micro-lens for each channel. Each channel is provided by one or more VCSELs.

In some embodiments the micro lenses may be cylindrical micro-lenses. The micro-lenses may have a tilt applied to re-direct the output to the appropriate sub-optic.

The beams 204 output by the micro-lenses 202 may be output to a primary optic arrangement 206.

The primary optic arrangement is provided by a single primary optic 208 which collimates all the channels with a shared approach. The primary optic may be a collimating lens with integrated beam shaping function. The lens may be a refractive lens with a relatively high radius to provide the collimation. The primary optic arrangement 206 also includes a conformal micro-lens array 209 to produce the diffuser function. In other embodiments, the primary optic arrangement 206 may be provided by a diffractive optic arrangement.

A beam shaping function is provided by the primary optic arrangement 206. The output of the primary optic arrangement 206 comprises N channels or beams 210. The use of the single primary optical element 208 may employ a smaller lens.

With this arrangement, there may be a reduced divergence. Due to the integrated optics on the VCSEL, these act to converge the output of the VCSEL. The redirection through VCSEL micro-lens optics may allow for a relatively high f/# primary optic lens design.

This arrangement may be able to support a relatively large number of channels. By way of example only, hundreds of channels may be supported. This is facilitated by the use of a single primary optic. This may mean that the primary optic does not need to scale significantly with the number of channels.

In the case where the VCSEL output is highly divergent before the primary optic, as in the previously described embodiments, then there will be a lower increase in optical power density when the primary optic is removed versus those options where there are no integrated optics in the VCSEL and so the output divergence may not be controlled in the same manner.

Figure 4:
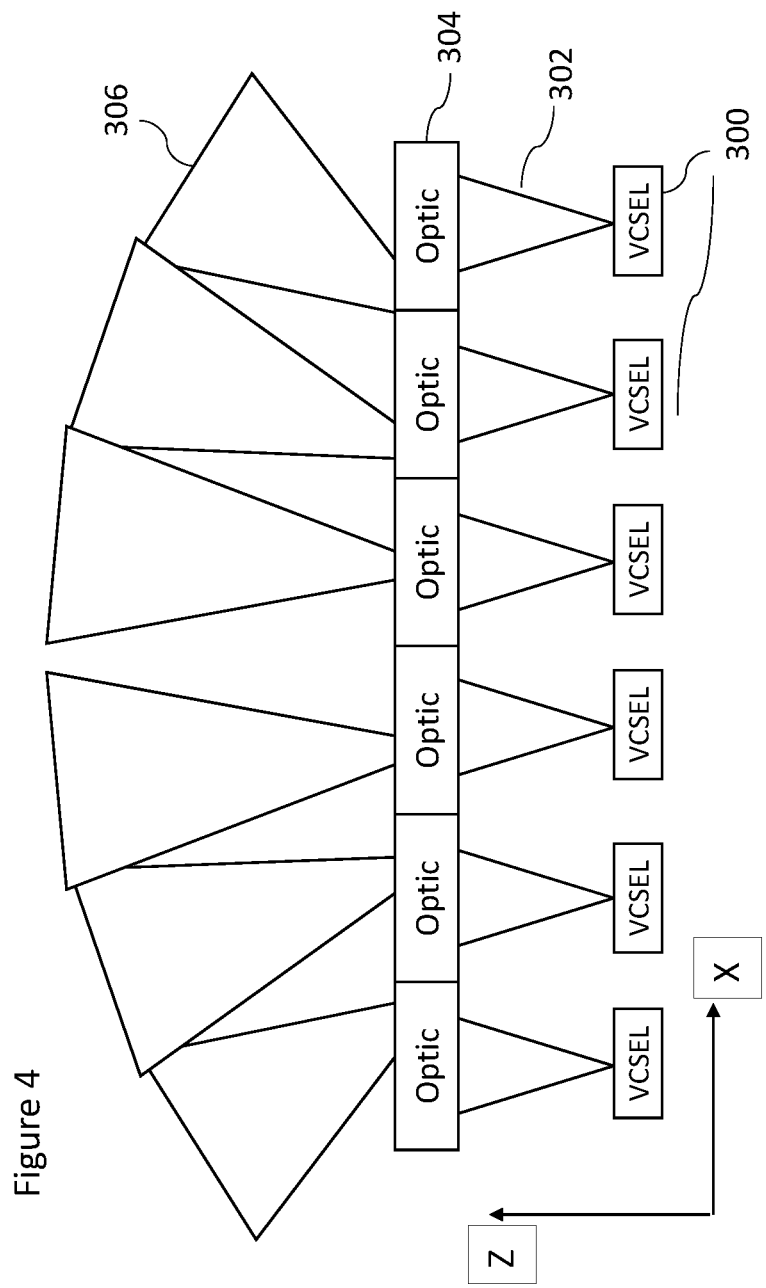
FIG. 4 shows a third arrangement for providing N light channels.

Third embodiments will now be described. In another embodiment which is shown in FIG. 4, the arrangement comprises multiple singulated VCSEL dies. Each die comprises one singulated VCSEL source 300. Each singulated VCSEL source provides a beam 302 which is provided to a primary optic arrangement. The primary optic arrangement has a plurality of optical elements 304, one for each singulated VCSEL source 300. Each optical element 304 includes a collimating lens 306 that collimates a respective channel and a beam shaping lens 307 that applies a beam shaping function to provide a respective one of the output beams 306. The output beams may provide the channels shown in FIG. 1. The beam shaping lenses 307 of the optical elements 304 may fan out the beams to provide the desired coverage area.

In some embodiments, a lens or other optical component may be provided on each VCSEL die. However, other embodiments may not require an optical component to be integrated with the VCSEL.

With the arrangement of FIG. 4, it is desirable to ensure that each VCSEL die 300 is aligned with respect to one another and with respect to the respective optical element 304. In this regard, reference is made to FIGS. 5a and 5b.

Figure 5B:
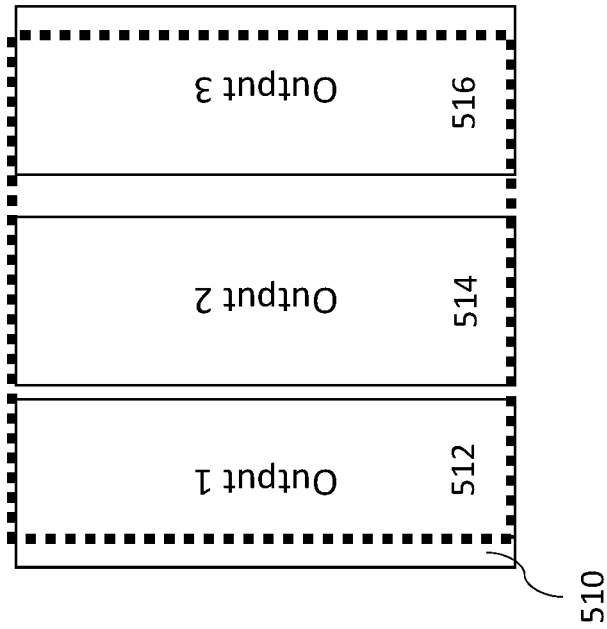
FIGS. 5a and 5b show a schematic view of potential misalignment of a VCSEL array and optical elements.
Figure 5A:
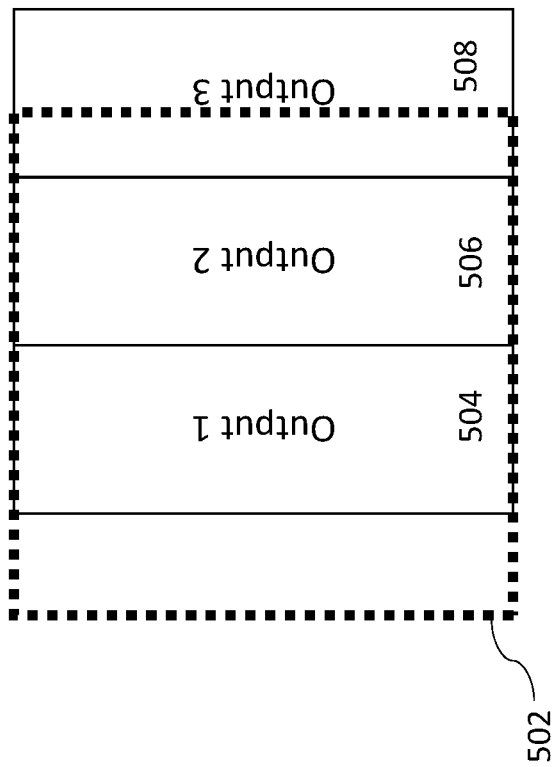

FIG. 5a illustrates a scenario where the VCSEL dies are correctly aligned but there is a misalignment between the VCSEL dies and the primary optical arrangement. In FIG. 5a, the output channels or beams are referenced 504, 506 and 508. These are the beams output by the primary optic arrangement. The target location for these beams is referenced 502 and represents where the beams should be located. As can be seen, from FIG. 5a, if all the VCSEL dies are misaligned with respect to the primary optic arrangement by the same amount then all output channels will have an equal angular offset with respect to the target 502. In some applications, the misalignment may for example approximately 4 degrees for a misalignment of 1 mm.

FIG. 5b illustrates a scenario where the VCSEL dies are misaligned but there is no misalignment between the VCSEL dies and the primary optical arrangement. In FIG. 5b, the output channels or beams are referenced 512, 514 and 516. These are the beams output by the primary optic arrangement. The target location for these beams is referenced 510 and represents where the beams should be located. As can be seen, from FIG. 5b, if the VCSEL dies are offset by differing amounts there will be an angular offset or gaps between output beams. In some applications, the misalignment may for example approximately 4 degrees for a misalignment of 1 mm.

It may even be possible to have a scenario where the VCSEL dies are misaligned and there is misalignment between the VCSEL dies and the primary optical arrangement.

Some embodiments utilize the assembly technique known as 'transfer printing' With this technique, it is possible to achieve a relatively high VCSEL to VCSEL die alignment accuracy (+/−2 μm). Transfer printing is a wafer scale process that allows alignment of individual die with respect to each other to be of the same order as wafer alignment tolerances. Since, as detailed above, the alignment is of the VCSEL die relative to each other so the transfer printing process may enable effective implementation of these embodiments.

Some embodiments may have the advantage that this arrangement is scalable to as many channels as desired. A main limitation may be the size of the module in the X/Y directions.

Some embodiments may prove a relatively high resolution system with the combination of the micro-lenses integrated into the VCSEL array and the primary optic arrangement. It should be appreciated that in some embodiments, one or other of the micro-lenses and the primary lens system may be omitted. This may be for systems which are desired to have a lower resolution.

Some embodiments may provide better laser safety in the case that the primary optic falls out. In the case where the VCSEL output is highly divergent before the primary optic then there will be a lower increase in optical power density when the primary optic is removed versus the embodiments where there are no integrated optics in the VCSEL.

In the above described embodiments, the substrate has been described as being of GaAs. However, it should be appreciated that this is by way of example only and different materials may be used for the substrate in different embodiments.

It should be appreciated that first embodiments, second embodiments and third embodiments have been described. Features described in relation to one embodiment may be used with other embodiments.

Figure 7:
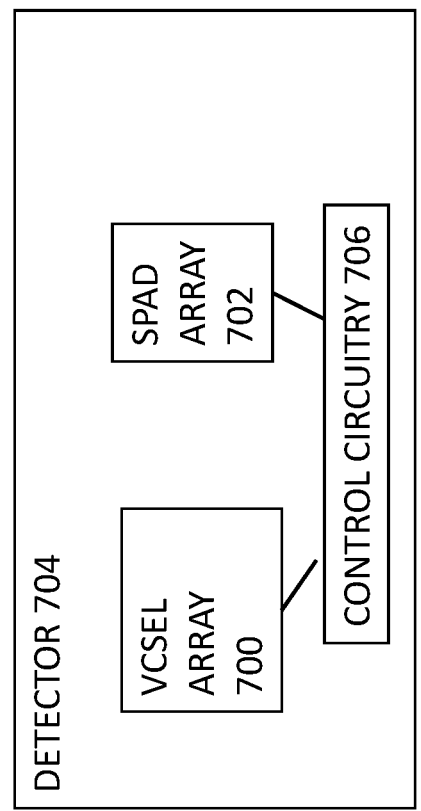
FIG. 7 schematically shows a detector of some embodiments.

Reference is made to FIG. 7 which schematically shows a detector 704. The detector has a VCSEL array. The VCSEL array may be any of the previously described arrangements. The detector has a SPAD or other suitable detector array 702 which is configured to receive light which has reflected off an object.

Control circuitry 706 is provided which is configured to control the VCSEL array and/or the SPAD array. The control circuitry may be configured to control which row or rows of the VCSEL array is activated. The control circuitry may control the SPAD array.

It should be appreciated that the above described arrangements may be implemented at least partially by an integrated circuit, a chip set, one or more dies packaged together or in different packages, discrete circuitry or any combination of these options.

Various embodiments with different variations have been described here above. It should be noted that those skilled in the art may combine various elements of these various embodiments and variations.

Such alterations, modifications, and improvements are intended to be part of this disclosure, and are intended to be within the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
   a plurality of singulated vertical-cavity surface-emitting laser dies each configured to output light; and
   an optical arrangement configured to receive light from the vertical-cavity surface-emitting lasers and to output a plurality of output light beams, the optical arrangement including one or more collimators configured to provide one or more collimated beams by collimating the light from the plurality of the vertical-cavity surface-emitting lasers and sub-optics configured to produce the plurality of output light beams by beam shaping the one or more collimated beams.

2. The apparatus as claimed in claim 1, wherein the sub-optics include an array of optical elements configured to produce the plurality of output light beams.

3. The apparatus as claimed in claim 1, wherein the one or more collimators comprises a shared optical element which is configured to receive light from each of the vertical-cavity surface-emitting lasers of the array.

4. The apparatus as claimed in claim 1, wherein the one or more collimators comprises a plurality of collimating lenses configured to produce plural collimated beams of the one or more collimated beams from the light received from the plurality of the vertical-cavity surface-emitting lasers.

5. The apparatus as claimed in claim 4, wherein the vertical-cavity surface-emitting lasers are configured to produce a plurality of input light beams and the one or more collimators comprises an array of collimating lenses respectively for each input light beam, one or more of the plurality of the vertical-cavity surface-emitting lasers being configured to provide each light beam.

6. The apparatus as claimed in claim 1, further comprising one or more micro-lenses provided on a substrate providing the array of vertical-cavity surface-emitting lasers.

7. The apparatus as claimed in claim 1, further comprising a plurality of lenses on the array of vertical-cavity surface-emitting lasers, one for each of the vertical-cavity surface-emitting lasers.

8. The apparatus as claimed in claim 1, further comprising a plurality of micro-lenses provided on a substrate providing the array of vertical-cavity surface-emitting lasers, wherein the one or more collimators include a shared collimating lens which is configured to receive light from each of the vertical-cavity surface-emitting lasers of the array.

9. The apparatus as claimed in claim 1, further comprising a plurality of micro-lenses provided on a substrate providing the array of vertical-cavity surface-emitting lasers, the micro-lenses being configured to provide a plurality of input light beams, wherein the one or more collimators include a plurality of collimating lenses, one collimating lens being provided for each input light beam.

10. The apparatus as claimed in claim 1, wherein the array of vertical-cavity surface-emitting lasers includes a plurality of singulated vertical-cavity surface-emitting laser dies, the singulated vertical-cavity surface-emitting laser dies being configured to provide a plurality of input light beams, and the one or more collimators comprise a plurality of collimating lenses, one being provided for each input light beam.

11. The apparatus as claimed in claim 1, comprising control circuitry configured to control which of the vertical-cavity surface-emitting lasers are activated.

12. The apparatus as claimed in claim 11, wherein the control circuitry is configured to control the array of vertical-cavity surface-emitting lasers to provide input light beams sequentially to the optical arrangement.

13. A detector, comprising;
   an apparatus configured to direct output light toward an object, the apparatus including:
      an array of vertical-cavity surface-emitting lasers, each of the vertical-cavity surface-emitting lasers being configured to be a source of light; and
      an optical arrangement including a primary optical lens configured to receive light from a plurality of the vertical-cavity surface-emitting lasers and to output a plurality of collimated beams, the optical arrangement including sub-optics configured to produce a plurality of output light beams by beam shaping the one or more collimated beams; and
   a light detector configured to detect light reflected from the object.

14. The detector as claimed in claim 13, wherein the light detector comprises an array of single photon avalanche diodes.

15. The detector as claimed in claim 13, further comprising a processor configured to calculate a distance between the detector and the object.

16. The detector as claimed in claim 15, wherein the processor is configured to calculate a phase shift between the light produced by the array of vertical-cavity surface-emitting lasers and the light reflected from the object.

17. An apparatus, comprising:
   an array of vertical-cavity surface-emitting lasers, each of the vertical-cavity surface-emitting lasers being configured to be a source of light; and
   an optical arrangement configured to receive light from the array of vertical-cavity surface-emitting lasers and to output a plurality of output light beams, the optical arrangement including a primary optical lens configured to receive the light from the light and to provide one or more collimated beams by collimating the light from the plurality of the vertical-cavity surface-emitting lasers and a micro-lens array configured to produce the plurality of output light beams by beam shaping the one or more collimated beams.

18. The apparatus as claimed in claim 17, comprising a light detector configured to detect the output light beams from the optical arrangement.

19. The apparatus as claimed in claim 18, comprising a processor configured to calculate a distance between the light detector and an object.

20. The apparatus as claimed in claim 19, comprising an array of single photon avalanche diodes coupled to the processor.

* * * * *

UNITED STATES PATENT AND TRADEMARK OFFICE
CERTIFICATE OF CORRECTION

PATENT NO. : 11,815,628 B2
APPLICATION NO. : 18/158448
DATED : November 14, 2023
INVENTOR(S) : Christopher Townsend et al.

Page 1 of 1

It is certified that error appears in the above-identified patent and that said Letters Patent is hereby corrected as shown below:

In the Claims

Column 10, Claim 13, Line 10:
"A detector, comprising;" should read: --A detector, comprising:--.

Signed and Sealed this
Ninth Day of January, 2024

Katherine Kelly Vidal
*Director of the United States Patent and Trademark Office*